United States Patent
Wurzinger et al.

(10) Patent No.: US 10,309,997 B2
(45) Date of Patent: Jun. 4, 2019

(54) APPARATUS AND A METHOD FOR GENERATING A SENSOR SIGNAL INDICATING INFORMATION ON A CAPACITANCE OF A VARIABLE CAPACITOR COMPRISING A VARIABLE CAPACITANCE

(71) Applicant: Infineon Technologies AG, Neubiberg (DE)

(72) Inventors: Christoph Bernhard Wurzinger, Weiz (AT); Andreas Wiesbauer, Poertschach (AT); Dieter Draxelmayr, Villach (AT); Dietmar Straeussnigg, Villach (AT)

(73) Assignee: Infineon Technologies AG, Neubiberg (DE)

( * ) Notice: Subject to any disclaimer, the term of this patent is extended or adjusted under 35 U.S.C. 154(b) by 252 days.

(21) Appl. No.: 13/835,274

(22) Filed: Mar. 15, 2013

(65) Prior Publication Data

US 2014/0266260 A1    Sep. 18, 2014

(51) Int. Cl.
*G01R 27/26* (2006.01)
*G01D 5/241* (2006.01)
(Continued)

(52) U.S. Cl.
CPC ......... *G01R 27/2605* (2013.01); *G01D 5/241* (2013.01); *H04R 19/005* (2013.01); *H04R 19/04* (2013.01)

(58) Field of Classification Search
CPC .... G01R 27/2605; G01D 5/2417; G01D 5/24; G01D 5/241; H04R 19/00; H04R 19/04;
(Continued)

(56) References Cited

U.S. PATENT DOCUMENTS 4,149,231 A * 4/1979 Bukosky et al. ............... 363/59
4,644,798 A * 2/1987 Tamura et al. ................. 73/708
(Continued)

OTHER PUBLICATIONS

Wang et al., Texas Instruments Application Report, "Compensate Transimpedance Amplifiers Intuitively", Mar. 2005.*
(Continued)

*Primary Examiner* — Lee E Rodak
(74) *Attorney, Agent, or Firm* — Eschweiler & Potashnik, LLC

(57) ABSTRACT

An apparatus for generating a sensor signal indicating information on a capacitance of a variable capacitor including a variable capacitance includes a sensor unit and a compensation unit. The sensor unit is configured to generate a sensor signal indicating information on a varying current flowing through a connection between the sensor unit and the variable capacitor caused by a variation of the capacitance of the variable capacitor while the variable capacitor is biased by a predefined bias voltage. Further, the compensation unit is configured to influence the sensor signal or to provide a compensation signal capable of influencing the sensor signal so that the sensor signal includes less nonlinear signal portions than a sensor signal without the influence of the compensation unit or the compensation signal.

18 Claims, 8 Drawing Sheets

(51) Int. Cl.
*H04R 19/00* (2006.01)
*H04R 19/04* (2006.01)

(58) Field of Classification Search
CPC ... H04R 19/005; G01P 15/125; G01P 15/131; G01L 9/12
USPC .............. 324/519, 548, 720, 750.17, 754.28, 324/658–690; 73/514.18, 514.25, 514.32
See application file for complete search history.

(56) References Cited

U.S. PATENT DOCUMENTS

| | | | | |
|---|---|---|---|---|
| 5,163,326 | A * | 11/1992 | Frick | G01L 9/12 361/283.3 |
| 5,325,065 | A * | 6/1994 | Bennett | G01P 15/125 324/661 |
| 5,343,766 | A * | 9/1994 | Lee | 73/862.61 |
| 5,454,266 | A * | 10/1995 | Chevroulet et al. | 73/514.18 |
| 5,600,066 | A * | 2/1997 | Torregrosa | G01P 15/131 73/514.18 |
| 5,612,494 | A * | 3/1997 | Shibano | 73/514.32 |
| 5,641,911 | A * | 6/1997 | Ryhanen | G01L 11/008 73/715 |
| 6,257,061 | B1 * | 7/2001 | Nonoyama et al. | 73/514.32 |
| 7,078,916 | B2 * | 7/2006 | Denison | 324/661 |
| 8,736,254 | B2 * | 5/2014 | Kanemoto | 324/162 |
| 8,860,154 | B2 * | 10/2014 | Wang | 257/416 |
| 2005/0022597 | A1 * | 2/2005 | Campbell | G01P 15/125 73/514.32 |
| 2005/0022598 | A1 * | 2/2005 | Campbell | G01P 15/18 73/514.32 |
| 2005/0040833 | A1 | 2/2005 | Yakabe et al. | |
| 2005/0218911 | A1 | 10/2005 | Denison | |
| 2005/0286111 | A1 | 12/2005 | Muenter | |
| 2006/0273805 | A1 | 12/2006 | Peng | |
| 2007/0018318 | A1 | 1/2007 | Marsh | |
| 2007/0220974 | A1 | 9/2007 | Wada | |
| 2007/0257890 | A1 * | 11/2007 | Hotelling | G06F 3/044 345/173 |
| 2010/0132466 | A1 * | 6/2010 | Spahlinger | 73/514.32 |
| 2011/0100126 | A1 * | 5/2011 | Jeong et al. | 73/514.32 |
| 2011/0142261 | A1 | 6/2011 | Josefsson | |
| 2012/0121106 | A1 | 5/2012 | Henrikson | |
| 2012/0217171 | A1 | 8/2012 | Wurzinger | |
| 2013/0028459 | A1 | 1/2013 | Wang | |
| 2013/0334844 | A1 * | 12/2013 | Lamesch | B60N 2/002 297/180.12 |
| 2014/0002116 | A1 * | 1/2014 | Wuerstlein | G01R 27/2605 324/681 |
| 2015/0323560 | A1 * | 11/2015 | Castellano | G01P 15/125 702/86 |

OTHER PUBLICATIONS

Rombach, et al. "The First Low Voltage, Low Noise Differentail Silicon Microphone, Technology Development and Measurement Results." Sensors and Actuators published in 2002. pp. 196-201. 6 Pages.

Citakovic, et al. "A Compact CMOS MEMS Microphone with 66db SNR." Published in 2009. IEEE International Solid-State Circuits Conference. pp. 350-352. 3 Pages.

\* cited by examiner

— constant voltage (-33.58dB THD)
— constant voltage, 2nd order compensation (-68.20dB THD)
— constant voltage, 3rd order compensation (-90.78dB THD)

APPARATUS AND A METHOD FOR GENERATING A SENSOR SIGNAL INDICATING INFORMATION ON A CAPACITANCE OF A VARIABLE CAPACITOR COMPRISING A VARIABLE CAPACITANCE

FIELD

Embodiments relate to variable capacitor technologies and in particular to an apparatus for generating a sensor signal indicating information on a capacitance of a variable capacitor comprising a variable capacitance and a method for generating a sensor signal indicating information on a capacitance of a variable capacitor comprising a variable capacitance.

BACKGROUND

Capacitors with variable capacitance are used in a wide range of applications. For example, in transducers of condenser microphones, also referred to as capacitor microphones or electrostatic microphones, or other electromechanical pressure sensing devices a membrane or diaphragm may act as one plate of a variable capacitor. Pressure changes lead to changes in the distance between the plates of the capacitor causing a variation of the capacitance.

Independent from the specific application of the variable capacitor, it is desired to detect an alteration of the capacitance of the variable capacitor with high accuracy.

SUMMARY

An apparatus for generating a sensor signal indicating information on a capacitance of a variable capacitor comprising a variable capacitance according to an embodiment comprises a sensor unit and a compensation unit. The sensor unit is configured to generate a sensor signal indicating information on a varying current flowing through a connection between the sensor unit and the variable capacitor caused by a variation of the capacitance of the variable capacitor while the variable capacitor is biased by a predefined bias voltage. Further, the compensation unit is configured to influence the sensor signal or to provide a compensation signal capable of influencing the sensor signal so that the sensor signal comprises less nonlinear signal portions than a sensor signal without the influence of the compensation unit or the compensation signal.

Due to the compensation unit, nonlinear signal portions within the sensor signal can be significantly reduced. In this way, the accuracy of determining information of a variation of the capacitance or an effect causing the variation of the capacitance can be improved.

Some embodiments relate to an apparatus for generating a sensor signal indicating information on a capacitance of a variable capacitor comprising a variable capacitance. The apparatus comprises a variable capacitor, a bias voltage unit, a sensor unit and a compensation unit. The variable capacitor comprises a variable capacitance and the bias voltage unit is configured to bias the variable capacitor by a predefined bias voltage. Further, the sensor unit is configured to generate a sensor signal indicating information on a varying current flowing through a connection between the sensor unit and the variable capacitor caused by a variation of the capacitance of the variable capacitor while the variable capacitor is biased by a predefined bias voltage. Further, the sensor unit comprises an inverting amplifier with a capacitive feedback connection to an inverting input of the amplifier and the variable capacitor is connected to the inverting input of the amplifier as well. The amplifier is configured to provide an analog sensor signal at an output of the amplifier. Further, the sensor unit comprises an analog-to-digital-converter connected to the amplifier and configured to generate the sensor signal based on an analog-to-digital conversion of the analog sensor signal. The compensation unit is configured to influence the sensor signal or to provide a compensation signal capable of influencing the sensor signal so that the sensor signal comprises less nonlinear signal portions than a sensor signal without the influence of the compensation unit or the compensation signal. Further, the compensation unit is configured to obtain a compensated sensor signal by combining the sensor signal generated by the sensor unit with a compensation signal so that the compensated sensor signal comprises less nonlinear signal portions than the sensor signal generated by the sensor unit or the compensation unit is configured to calculate a compensated sensor signal based on the sensor signal generated by the sensor unit or configured to determine a compensated sensor signal by selecting corresponding date from a lookup table based on the sensor signal generated by the sensor unit.

Some embodiments relate to an apparatus for generating a sensor signal indicating information on a capacitance of a variable capacitor comprising a variable capacitance. The apparatus comprises a variable capacitor, a bias voltage unit, a sensor unit and a compensation unit. The variable capacitor comprises a variable capacitance. Further, the variable capacitor with the variable capacitance comprises a membrane between two backplates. The bias voltage unit is configured to bias the membrane of the varying capacitor by a predefined bias voltage. The sensor unit is configured to generate a sensor signal indicating information on a varying current flowing through a connection between the sensor unit and the variable capacitor caused by a variation of the capacitance of the variable capacitor while the variable capacitor is biased by the predefined bias voltage. Further, the sensor unit comprises an inverting amplifier with a capacitive feedback connected to an inverting input of the amplifier. A first backplate of the variable capacitor is connected to the inverting input of the amplifier as well and the amplifier is configured to provide the sensor signal at an output of the amplifier. The compensation unit is configured to provide a compensation signal capable of influencing the sensor signal so that the sensor signal comprises less nonlinear signal portions than a sensor signal without the influence of the compensation signal. Further, the compensation unit comprises an inverting amplifier with a capacitive feedback connected to an inverting input of the amplifier. A second backplate of the variable capacitor is connected to the inverting input of the amplifier as well and the amplifier is configured to provide the compensation signal at an output of the amplifier.

Some embodiments relate to an apparatus for generating a sensor signal indicating information on a capacitance of a variable capacitor comprising a variable capacitance. The apparatus comprises a variable capacitor, a sensor unit and a compensation unit. The variable capacitor comprises a variable capacitance. Further, the variable capacitor with the variable capacitance comprises a membrane between two backplates. The sensor unit is configured to generate a sensor signal indicating information on a varying current flowing through a connection between the sensor unit and the variable capacitor caused by a variation of the capacitance of the variable capacitor while the variable capacitor is biased by a predefined bias voltage. Further, the sensor unit comprises an inverting amplifier with a capacitive feedback connected to an inverting input of the amplifier. The membrane of the variable capacitor is connected to the inverting input of the amplifier as well and the amplifier is configured to provide the sensor signal at an output of the amplifier. The compensation unit is configured to influence the sensor signal so that the sensor signal comprises less nonlinear signal portions than a sensor signal without the influence of the compensation unit. Further, the compensation unit comprises a bias voltage unit configured to bias a first backplate by a first predefined bias voltage and a second backplate by a second predefined bias voltage. The sensor unit is configured to bias the membrane with a third predefined bias voltage and to generate the sensor signal indicating a varying current flowing through a connection between the sensor unit and the variable capacitor caused by movement of the membrane of the variable capacitor.

Some embodiments relate to a silicon microphone with an apparatus for generating a sensor signal indicating information on a capacitance of a variable capacitor comprising a variable capacitance according to the described concept.

Further embodiments relate to a method for generating a sensor signal indicating information on a capacitance of a variable capacitor with a variable capacitance. The method comprises generating a sensor signal indicating a varying current flowing through a connection between the sensor unit and the variable capacitor caused by a variation of the capacitance of the variable capacitor biased by a predefined bias voltage. Further, the method comprises influencing the sensor signal by a compensation unit so that the sensor signal comprises less nonlinear signal portions than a sensor signal without the influence of the compensation unit.

BRIEF DESCRIPTION OF THE DRAWINGS

Some embodiments of apparatuses and/or methods will be described in the following by way of example only, and with reference to the accompanying figures, in which.

DETAILED DESCRIPTION

Figure 1:
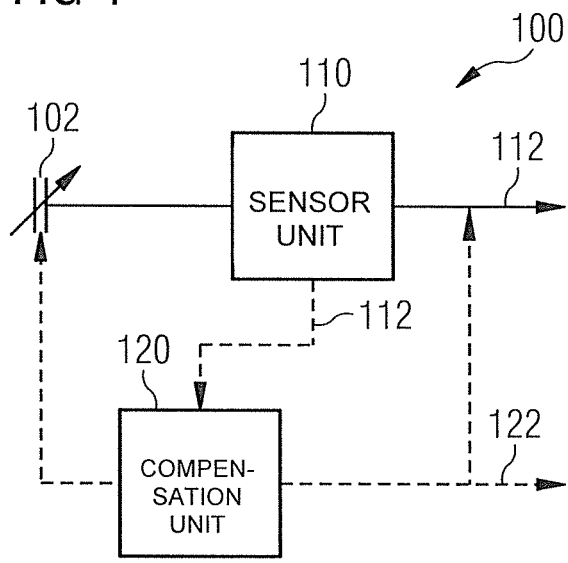
FIG. 1 shows a schematic illustration of an apparatus for generating a sensor signal.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

A sensor signal comprising information on a capacitance of a capacitor with variable capacitance can be generated based on different principles. For example, for capacitive sensors (e.g. used for microphones, silicon microphones, SIMIC), at least two possibilities for generating a desired signal may be applied.

In one example, the charge of the capacitor (e.g. formed by a movable membrane and a backplate of a micro electro mechanical system MEMS for a silicon microphone SIMIC) can be kept (substantially) constant (constant charge approach). In this way, a readout circuit provides a voltage which is directly proportional to the membrane displacement. Consequently, there may be a linear correlation between the pressure (causing the membrane displacement) and the measured voltage. However, there may be difficulties when using this method for very high pressures (or very high sound levels at microphone applications SIMIC). The signal level (especially within the application-specific integrated circuit ASIC or at the input thereof) of microphones may be adapted optimally to an assumed pressure level of 94 dBSPL (or modules may be controlled optimally), for example. If the microphone would process very high sound levels (up to 140 dBSPL) or more, inadmissible high signal levels may occur.

Alternatively, the voltage at the capacitor may be kept (substantially) constant (constant voltage approach). In this case, an (substantially) indirect proportional connection between the measured current (desired signal) and pressure (e.g. so-called 1/x behavior) may occur. In this way, inadmissible high voltage levels may be avoided (in comparison to the approach above). However, nonlinear effects (e.g. harmonic signal portions) may occur. These effects may increase with higher signal amplitudes, i.e. this phenomenon may occur very strongly at very high sound levels.

By using the proposed concept described above or an embodiment described below, such nonlinear effects may be minimized or at least reduced.

FIG. 1 shows a block diagram of an apparatus 100 for generating a sensor signal 112 indicating or comprising information on a capacitance of a variable capacitor 102 comprising a variable capacitance according to an embodiment. The apparatus 100 comprises a sensor unit 110 and a compensation unit 120. The sensor unit 110 is connected to the variable capacitor 102 and the compensation unit 120 is connected to the sensor unit 110 and/or the variable capacitor 102. The sensor unit 110 generates a sensor signal 112 indicating information on the varying current flowing through a connection between the sensor unit 110 and the variable capacitor 102 (e.g. from the variable capacitor 102 and/or to the variable capacitor 102) caused by a variation of the capacitance of the variable capacitor 102 while the variable capacitor 102 is biased by a predefined bias voltage. The compensation unit 120 influences the sensor signal 112 or provides a compensation signal 122 capable of or suitable for influencing the sensor signal 112 (i.e. the compensation signal may be capable of or suitable for influencing the sensor signal) so that the sensor signal 112 comprises less nonlinear signal portions than a sensor signal without the influence of the compensation unit 120 or the compensation signal 122.

Due to the compensation unit 120 or the compensation signal 122, the nonlinear signal portions appearing, when the variable capacitor 102 is biased by a predefined bias voltage and the varying current is sensed, can be significantly reduced. In this way, the accuracy of determining the capacitance of the variable capacitor 102 or an effect causing the variation of the capacitance (e.g. sound pressure or acceleration) can be increased.

The variable capacitor 102 is biased by a predefined bias voltage. Therefore, an alteration of the capacitance of the variable capacitor 102 causes a current flow going to the variable capacitor 102 (e.g. if the capacitance is increase) or a current flow coming from the variable capacitor 102 (e.g. if the capacitance is decreased). For example, an oscillating variation of the capacitance may cause also an oscillating current flowing through the connection between the sensor unit 110 and the variable capacitor 102. This current flow can be sensed by the sensor unit 110 and a sensor signal 112 comprising information on the varying current flowing through a connection between the sensor unit and the variable capacitor 102 can be generated and provided.

For example, the predefined bias voltage may be substantially a constant voltage. The bias voltage may be substantially constant, if the bias voltage varies less than 20% (or less than 10%, less than 5% or less than 1%) of the predefined bias voltage, if the capacitance of the variable capacitor 102 is varied. In other words, if the capacitance of the variable capacitor 102 is varied, the predefined bias voltage is supplied (e.g. by a bias voltage unit) so that mainly a current from or to the variable capacitor 102 is varied while the bias voltage remains substantially unchanged. The predefined bias voltage may be an electrical potential applied to an electrode of the variable capacitor (e.g. the membrane or a backplate) or a difference of potentials applied between two electrodes (e.g. a membrane and a backplate) of the variable capacitor 102. For example, the predefined bias voltage may be a supply voltage of the apparatus 100, ground, the negative supply voltage of the apparatus 100 or twice the supply voltage of the apparatus 100.

The variable capacitor 102 can be implemented in various ways. For example, a micro electro mechanical system (MEMS) can be used for implementing a variable capacitor. Such a micro electro mechanical system may comprise a movable or bendable beam or a movable or bendable membrane which changes the distance to an electrode (e.g. a backplate) in response to a force (e.g. sound pressure, air pressure, acceleration). For example, a membrane can be manufactured above a cavity on a semiconductor die (e.g. a silicon die). The bottom of the cavity may be used as backplate electrode so that the backplate and the membrane form a capacitor. The membrane may be bent towards the backplate and away from the backplate, if a varying force is applied to the backplate. Also a variable capacitor 102 with a membrane between two backplates may be possible. Such variable capacitors 102 may be used in various applications (e.g. microphones, pressure sensors or acceleration sensors).

The compensation unit 120 can influence the sensor signal 112 or provide a compensation signal 122 capable of influencing the sensor signal 112 in various ways. For example, the compensation unit 120 can generate a compensation signal 122 comprising at least partly signal portions inverse to the nonlinear signal portions of the sensor signal 112 (e.g. by approximating the nonlinear signal portions or by sensing a varying current at a second backplate of the variable capacitor). Such a compensation signal 122 can be combined with (e.g. subtracted from or added to) the sensor signal 112 generated by the sensor unit 110 or may be provided together with the sensor signal 112 of the sensor unit 110 for further processing (e.g. combining the signals by an external device). Alternatively, the compensation unit 120 may influence the sensor signal 110 by manipulating or influencing the variable capacitor 102 (e.g. provide bias voltages for two backplates of a double backplate capacitor). In this way, the sensor signal 112 is influenced indirectly through the control of the variable capacitor 102. Alternatively, the sensor signal 112 may be influenced by the compensation unit 120 directly (e.g. by calculating a compensated sensor signal based on the sensor signal of the sensor unit or determining a compensated sensor signal by selecting corresponding data from a lookup table). The different examples are indicated by the dashed lines in FIG. 1.

For example, nonlinear signal portions may be signal portions representing a nonlinear deviation from an idle signal. The capacitance of the variable capacitor 102 may be varied by a variation of the distance (e.g. an average distance or a minimal or a maximal distance) of the electrodes of the variable capacitor 102 (e.g. by a displacement of a membrane). In this example, the sensed current from or to the variable capacitor 102 may be approximately indirectly proportional (e.g. 1/x behavior) to the distance of the electrodes (e.g. a membrane and a backplate) of the variable capacitor 102. Due to the indirect proportionality, nonlinear effects may cause nonlinear signal portions within the sensor signal 112. For example, harmonic frequencies of a fundamental frequency of a sinusoidal stimulation of a membrane of a variable capacitor may occur within a sensor signal. Such nonlinear signal portions may be reduced by the compensation unit 120 or the compensation signal 122. In other words, the variable capacitor 102 may comprise a membrane and at least one backplate and the compensation unit 120 may influence the sensor signal 112 or provide a compensation signal 122 capable of influencing the sensor signal 112 so that the sensor signal 112 comprises less nonlinear signal portions caused by a nonlinear correlation of the varying current and the distance between the membrane and the at least one backplate than a sensor signal without the influence of the compensation unit and/or the compensation signal 122. Optionally, also nonlinear signal portions caused by other effects (e.g. caused by parasitic capacitance) may be reduced additionally by the compensation unit 120 or the compensation signal 122.

The sensor unit 110 may be implemented in various ways. For example, the varying current flowing through a connection between the sensor unit 110 and the variable capacitor 102 may be amplified and/or converted to a voltage signal. For example, optionally, alternatively or additionally to one or more aspects mentioned above, the sensor unit 110 may comprise an inverting operational amplifier with a capacity feedback (e.g. comprising a feedback capacitor) of an output of the operational amplifier connected to an inverting input of the operational amplifier. Further, the variable capacitor 102 may be connected to the inverting input of the operational amplifier as well and the operational amplifier may provide a sensor signal 112 at the output of the operational amplifier.

The connection to the variable capacitor can also be biased to another voltage than ground by applying a voltage to the non-inverting input of the operational amplifier causing the same voltage at the inverting input of the operational amplifier.

Figure 2:
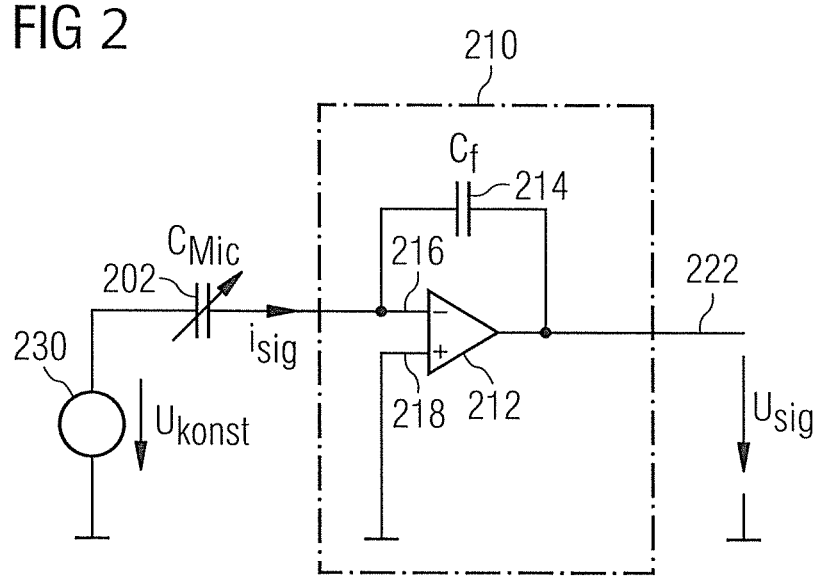
FIG. 2 shows a schematic illustration of a further apparatus for generating a sensor signal.

An example of a sensor unit 210 with an operational amplifier is shown in FIG. 2. The sensor unit 210 comprises an operational amplifier 212 with a non-inverting input 218 connected to ground. The output 222 of the operational amplifier is fed back to an inverting input 216 of the operational amplifier 212 through a feedback capacitor $C_f$ 214. A first electrode (e.g. membrane or backplate) of the variable capacitor $C_{mic}$ 202 is connected to the inverting input 216 of the operational amplifier 212 as well. Further, the second electrode (e.g. membrane or backplate) of the variable capacitor $C_{mic}$ 202 is connected to a bias voltage unit 230 biasing the second electrode by a predefined bias voltage $U_{const}$. If the capacitance of the variable capacitor 202 varies, a varying current $I_{sig}$ occurs at the inverting input 216 of the operational amplifier 212 and the feedback capacitor 214 causing an output voltage $U_{sig}$ representing the sensor signal. The first electrode is biased to ground by the virtual ground connection through the non-inverting input 218 of the operational amplifier 212.

For example, FIG. 2 may show an example of a circuit for a constant voltage approach mentioned above. $C_{mic}$ may indicate a microphone capacitor, which may be formed by a membrane and a so-called backplate of a micro electro mechanical system. $U_{const}$ may determine the constant voltage at $C_{mic}$. The capacitor $C_f$ may determine together with $C_{mic}$ the gain. The current $I_{sig}$ (and consequently also $U_{sig}$) may be indirectly proportional to a pressure at the membrane (or a displacement of the membrane). This may cause undesired nonlinear effects as already mentioned. The example shown in FIG. 2 may be a readout circuit in a constant voltage mode representing a micro electro mechanical system with amplifier (constant voltage), for example.

Figure 3:
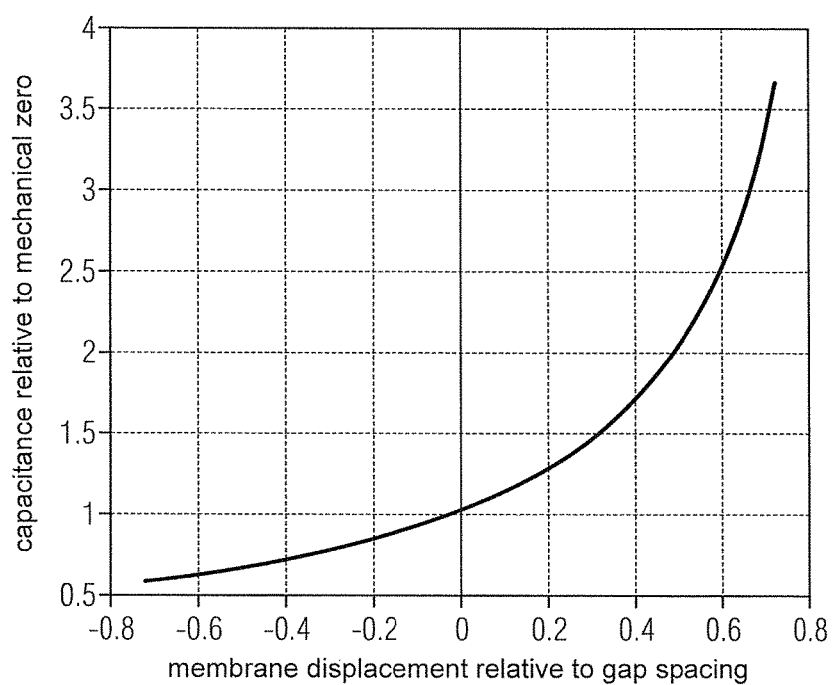
FIG. 3 shows a diagram indicating a capacitance depending on a membrane displacement.

FIG. 3 shows a diagram illustrating an example of a possible 1/x behavior of a membrane displacement relative to a gap spacing versus a capacitance relative to a mechanical zero, i.e. a capacitance as a function of a membrane displacement.

For example, FIG. 3 shows an approximated correlation between the membrane displacement and the resulting capacitance (e.g. representing the mentioned nonlinearity). A sound pressure applied to the membrane may cause an alteration of the capacitance and in the circuitry, for example, of FIG. 2, the capacitance difference relative to a position of rest generates a current resulting in an output voltage. Due to the nonlinearity, the total harmonic distortion (THD) may be relatively high.

In other words, the variation of the sound pressure level may comprise an inverse relationship to a variation of the capacitance. An inverse relationship may be a 1/x behavior, for example. However, the inverse relationship may slightly deviate from the 1/x behavior (e.g. due to manufacturing variations). For example, the sound pressure level may be inverse proportional to a variation of the capacitance with a tolerance of less than 30% (or 20% or 10%) of an exactly inverse proportional capacitance.

As already mentioned, the compensation unit 120 may influence the sensor signal 112 or provide a compensation signal 122 capable of influencing the sensor signal 112 in various ways. For example, optionally, alternatively or additionally to one or more of the aspects mentioned above, the compensation unit may generate a compensation signal indicating an approximation of the inverse of the nonlinear signal portions of the sensor signal 112. In other words, a sensor signal 112 can be analyzed and nonlinear signal portions can be identified or simulations may be done. A signal with an inverse behavior or an approximately inverse behavior can be generated. This compensation signal 122 can be combined with the sensor signal 112 or may be provided for further processing. For example, the compensation unit 120 may optionally generate the compensation signal 122 based on an approximation by a polynomial of the second order or the third order of the sensor signal 112 (or even a higher order polynomial). In this way, the nonlinear signal portions can be significantly reduced.

The sensor signal 112 and/or the compensation signal 122 may be analog or digital signals and may be processed by analog signal processing or digital signal processing. For example, the sensor unit 110 may comprise optionally, alternatively or additionally to one or more aspects mentioned above, an analog-to-digital-converter (ND converter) for generating the sensor signal 112 based on an analog-to-digital-conversion of an analog sensor signal indicating the varying current flowing through a connection between the sensor unit 110 and the variable capacitor 102 (e.g. from the variable capacitor and to the variable capacitor) caused by the variation of the capacitance of the variable capacitor 102.

Alternatively, the compensation unit 120 may directly process the sensor signal 112 to obtain a compensated sensor signal or to generate the compensated sensor signal based on the sensor signal 112 generated by the sensor unit 110. For this, the compensation unit 120 may comprise an input for receiving the sensor signal 112 generated by the sensor unit 110 and comprise an output for providing the compensated sensor signal. For example, the compensation unit 120 may calculate the compensated sensor signal based on the sensor signal 112 generated by the sensor unit 110. For example, the sensor signal generated by the sensor unit may be used as input for a calculation algorithm (e.g. approximation algorithm for the nonlinear signal portions) resulting in the compensated sensor signal with reduced nonlinear signal portions. Alternatively, the compensation unit 120 may determine the compensated sensor signal by selecting corresponding data from a lookup table based on the sensor signal generated by the sensor unit 110. In other words, the compensation unit 120 may select predefined values stored in a lookup table based on signal values of the received sensor signal 112 so that the obtained compensated sensor signal comprises less nonlinear signal portions than the received sensor signal 112. The lookup table may be stored by a memory unit of the compensation unit 120 or by an external memory unit. Optionally, the sampling points stored by the lookup table may be interpolated in order to provide intermediate points.

Figure 4:
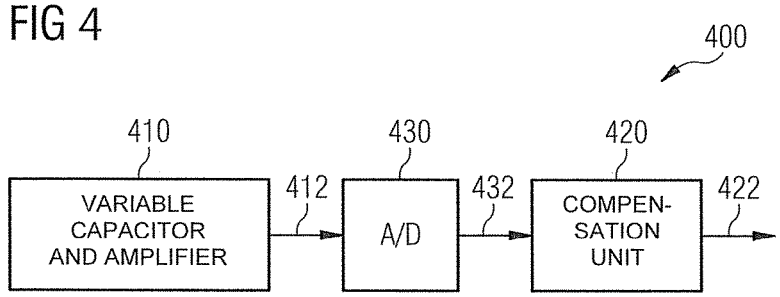
FIG. 4 shows a block diagram of an apparatus for generating a sensor signal.

FIG. 4 shows an apparatus 400 for generating a sensor signal 422 indicating information on a capacitance of a variable capacitor according to an embodiment. The apparatus 400 comprises a variable capacitor and amplifier 410 connected to an analog-to-digital-converter 430. The analog-to-digital-converter 430 is connected to a compensation unit 420. The amplifier provides an analog sensor signal 412 to the analog-to-digital-converter 430. The analog-to-digital-converter 430 converts the analog sensor signal 412 to a digital sensor signal 432 and provides the digital sensor signal 432 to the compensation unit 420. The compensation unit 420 may process the digital sensor signal 432 according to one of the examples mentioned above to obtain a compensated sensor signal 422.

In other words, FIG. 4 shows an arrangement for reducing or minimizing nonlinear effects by applying a readout circuit as shown in FIG. 2, for example. The inverse of the nonlinearity (e.g. circuit shown in FIG. 2) may be digitally implemented or approximated for reducing or minimizing the nonlinear effect. In this case, a static nonlinearity (e.g. 1/x behavior) may be assumed so that the inverse may be representable by a static nonlinearity (e.g. nonlinear characteristic) as well. This may be easily implemented digitally. A digital implementation may be achieved by a lookup table, for example. Also, a lookup table with few sampling points in combination with an interpolation method (e.g. linear interpolation) may be applied to save memory. Further, or alternatively, the nonlinearity may be approximated by a polynomial.

For example, FIG. 4 may show an example for a readout circuit with constant voltage mode and nonlinear digital compensation. Such a topology may comprise a readout circuit (part of a sensor unit) with constant voltage mode, an analog-to-digital-converter (e.g. also part of the sensor unit) and a nonlinear digital compensation (e.g. compensation unit). A readout circuit may comprise an MEMS device (as example for a variable capacitor) and an amplifier (constant voltage).

Figure 5:
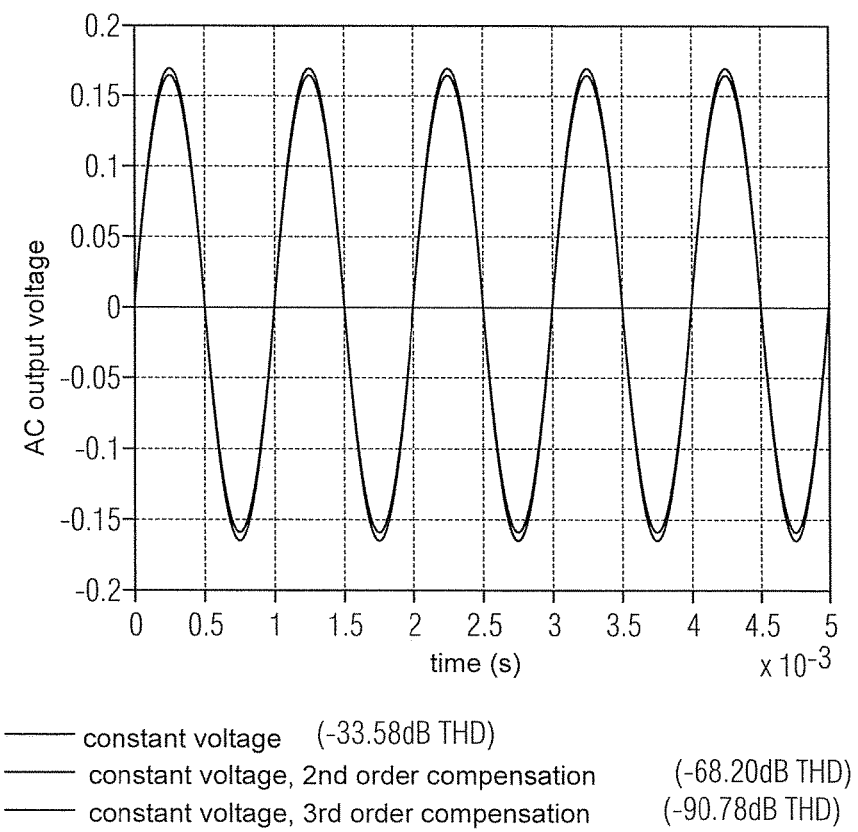
FIG. 5 shows a diagram comparing output signals without compensation and with compensation of second or third order.

For example, FIG. 5 shows simulation results for circuitry, for example, shown in FIG. 2 at a sound pressure of 94 dBSPL. The total harmonic distortion adds up to −33.58 dB without compensation. The digital compensation with a polynomial of second order is sufficient to reduce the THD to −68.2 dB and with a polynomial of third order−90.8 dB can be achieved. FIG. 5 shows an AC (alternating current) output voltage over time.

Figure 6:
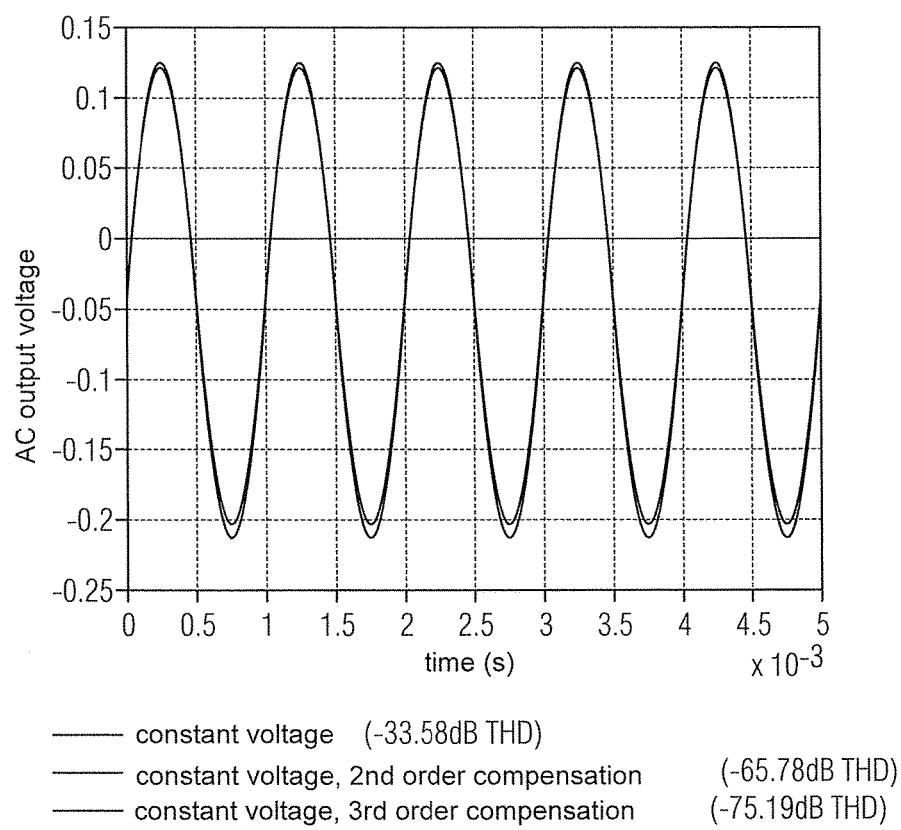
FIG. 6 shows a diagram indicating an influence of an offset error (1% of the bias voltage) for the compensation.
Figure 7:
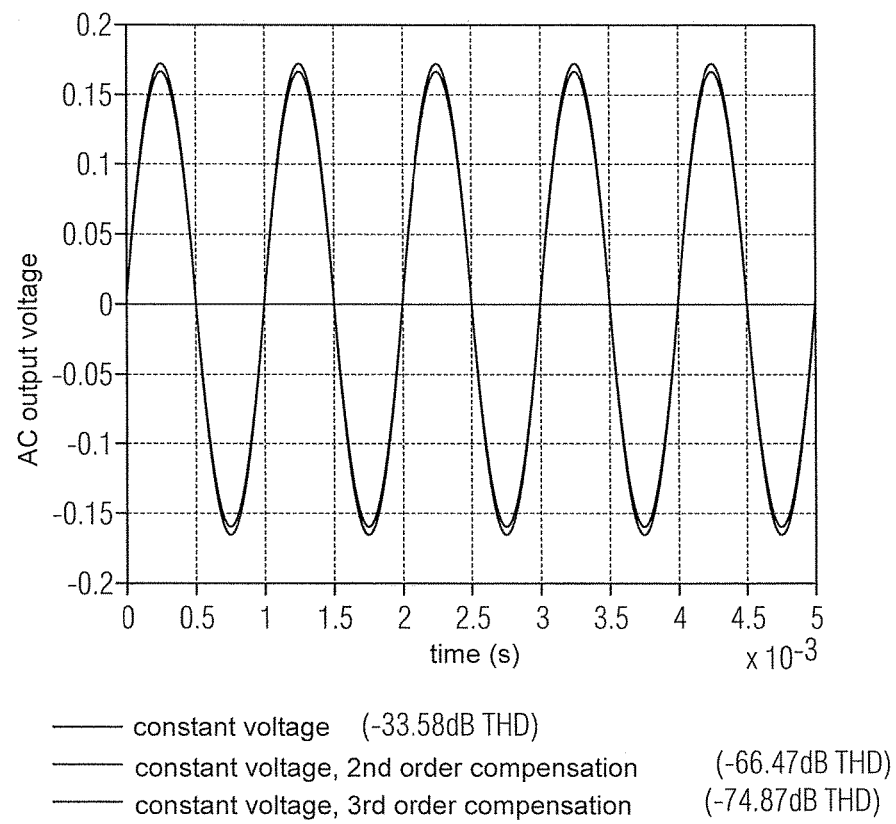
FIG. 7 shows a diagram indicating an influence of a gain error of 1% for the compensation.
Figure 8:
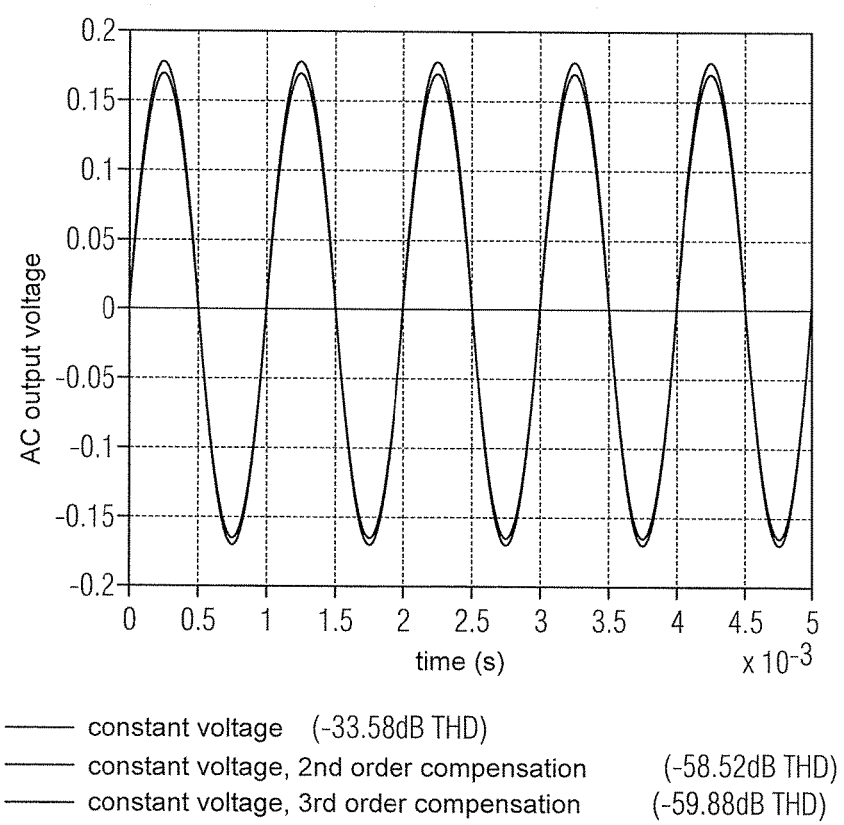
FIG. 8 shows a diagram indicating an influence of a gain error of 5% for the compensation.

These values may not be entirely reached due to gain errors and zero point errors. Exemplary simulation results for 5% gain error and a zero point error of 5% of the bias voltage are illustrated in FIGS. 6, 7 and 8. Even in the presence of these errors, an improvement of the THD of more than 26 dB can be achieved without further measures (e.g. a calibration).

For example, compensation by a polynomial of second or third order may be used for the assumed nonlinearity of the micro electro mechanical system as it is shown in FIG. 3. The nonlinearity of FIG. 3 can result in the following correlation between sound pressure and the alternating voltage portion of the output voltage, for example.

$$U_a = x(p)/(x(0) - x(p))$$

$U_a$ indicates the sensor signal, $x(p)$ indicates a position of the membrane depending on the sound pressure p and $x(0)$ indicates a position of rest.

For the nonlinear compensation, the following polynomials were used for the further simulation results.

$$U_{akomp2} = -U_a^2 + U_a$$

$$U_{akomp3} = U_a^3 - U_a^2 + U_a$$

$U_{akomp2}$ indicates a second order compensation signal and $U_{akomp3}$ indicates a third order compensation signal. The respective compensation signal can be subtracted from the sensor signal to obtain a compensated sensor signal comprising reduced nonlinear signal portions.

Optionally, alternatively, or additionally to one or more aspects mentioned above, the variable capacitor 102 may comprise a membrane between two backplates. Such a double backplate capacitor may provide the possibility for further ways of compensation of nonlinear signal portions. For example, the membrane may be biased with the predefined bias voltage and the sensor unit 110 is connected to a first backplate of the sensor capacitor. Further, the sensor unit 110 may generate the sensor signal 112 indicating a varying current from or to the first backplate of the variable capacitor 102 caused by a movement of the membrane of the variable capacitor 102. Further, the compensation unit 120 may be connected to the second backplate of the variable capacitor and may generate a compensation signal 122 indicating a varying current from or to the second backplate of the variable capacitor 102 caused by the movement of the membrane of the variable capacitor 102. In other words, the movable membrane of the variable capacitor 102 may cause two independent signals at the two different backplates. These signals comprise both nonlinear signal portions. If the membrane moves in the direction of the first backplate, the capacitance of the capacitor formed by the membrane and a first backplate increases and the capacitance of the capacitor formed by the membrane and a second backplate decreases. The increase is higher than the decrease so that a sufficient signal remains if the sensor signal and the compensation signal are combined (e.g. by subtracting or adding), for example. However, the nonlinear signal portions may be reduced, if the two signals are combined (e.g. reducing or removing even order nonlinear effects).

The compensation unit 120 can generate the compensation signal 122 in various ways. For example, the compensation unit 120 may generate the compensation signal 122 similarly to the generation of the sensor signal 112.

Optionally, alternatively or additionally to one or more aspects mentioned above, the compensation unit 120 may comprise an inverting operational amplifier with a capacitive feedback connected to an inverting input of the operational amplifier. Further, a second backplate of the variable capacitor 102 may be connected to the inverting input of the operational amplifier as well and the operational amplifier may provide the compensation signal 122 at an output of the operational amplifier. In this way, the compensation unit 120 can be implemented similarly to the construction of the sensor unit 210 shown in FIG. 2.

Alternatively, the operational amplifier of the sensor unit and the operational amplifier of the compensation unit may be implemented together as a differential inverting amplifier.

The membrane, the first backplate and the second backplate of the variable capacitor 102 may be biased in different ways. For example, the sensor unit 110 may bias the first backplate by a first predefined bias voltage and the compensation unit 120 may bias the second backplate by a second predefined bias voltage. Further, the apparatus 100 may comprise a bias voltage unit configured to bias the membrane by a third predefined bias voltage. In one example, the first predefined bias voltage and the second predefined bias voltage may be equal to ground and the third predefined bias voltage may be different (e.g. the supply voltage of the apparatus) to the first predefined bias voltage and the second predefined bias voltage. Alternatively, the first predefined bias voltage, the second predefined bias voltage and the third predefined bias voltage may be selected so that the nonlinear signal portions of the sensor signal may be lower than the nonlinear signal portions of a sensor signal generated with the first predefined bias voltage being equal to the second predefined bias voltage. In other words, the first predefined bias voltage and the second predefined bias voltage may be selected slightly different from each other, so that an improved reduction of the nonlinearities can be achieved and/or manufacturing variations of the variable capacitor or the electrical circuitry can be considered.

Figure 9:
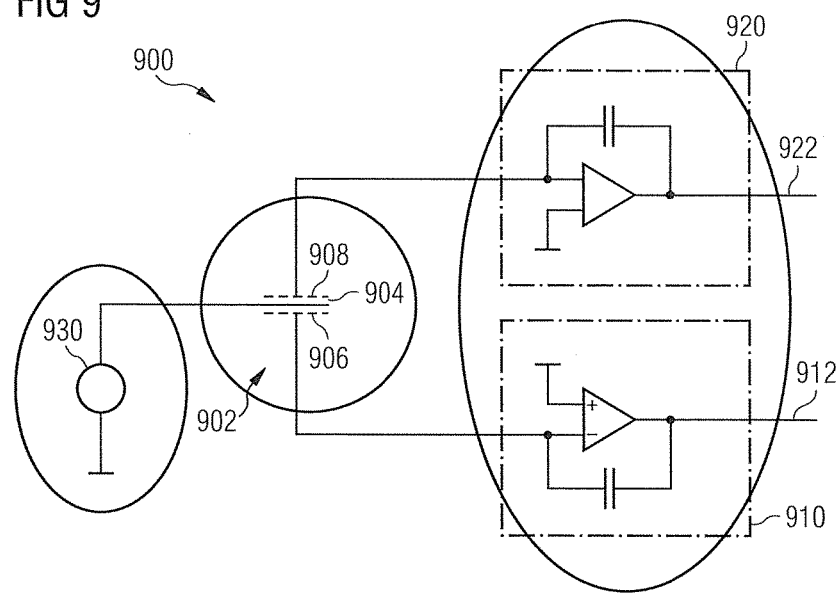
FIG. 9 shows a schematic illustration of an apparatus for generating a sensor signal.

FIG. 9 shows a schematic illustration of an apparatus 900 for generating a sensor signal 912 indicating information on a capacitance of a variable capacitor 902 according to an embodiment. In this example, the variable capacitor 902 comprises a membrane 904, a first backplate 906 and a second backplate 908. The membrane 904 is biased by a bias voltage unit 930. Further, the first backplate 906 is connected to an inverting input of an operational amplifier of the sensor unit 910 as it was already described and shown in FIG. 2. The sensor signal 912 is provided at an output of the operational amplifier of the sensor unit 910. The compensation unit 920 is connected to the second backplate 908 and comprises a construction equal or similar to the sensor unit 910. Therefore, the explanations and comments as well as the different aspects mentioned in connection with the sensor unit described and shown in FIG. 2 are also applicable to the sensor unit 910 and the compensation unit 920 of the apparatus 900. Consequently, the second backplate 908 is connected to an inverting input of the operational amplifier of the compensation unit 920 and the compensation signal 922 is provided by an output of the operational amplifier of the compensation unit 920.

For example, FIG. 9 shows a simplified circuitry for the constant voltage approach mentioned above. A MEMS-sensor may be used, which comprises a second readout electrode (dual backplate MEMS). The membrane may be adjusted to an appropriate DC voltage (direct current voltage). Both backplates may be connected to an input of an inverting amplifier. Consequently, two output signals may be obtained which may be nonlinear respectively in the corresponding CV-operation (constant voltage). However, the difference of both signals may be significantly less distorted, since at least distortions of even order may compensate or reduce each other.

This example may be a possibility which may work also for analog ASICs (application-specific integrated circuits). The differential signal may be further processed.

In this example, the dynamic range of the ASIC (of the apparatus for generating the sensor signal) can be extended without increasing the supply voltage. For example, 6 dB more dynamic range may be available due to the double readout electrode which can be used for a better signal-to-noise ratio (SNR) or a higher signal level (e.g. sound pressure), for example by appropriate dimensioning.

A topology comprising differential readout circuitry in the constant voltage mode (current interface) and a dual backplate MEMS can be provided. In other words, FIG. 9 may show readout circuitry in the constant voltage mode and the MEMS device comprises a second readout electrode (MEMS with two backplates). Further, both backplates may be connected to inverting amplifiers.

The topology shown in FIG. 9 may be implemented in various ways. The bias voltage (e.g. between 3 V and 15 V) may be generated from a charge bump from a typical ASIC supply voltage (e.g. 1.8 V or 3.3 V) and may be fed to the membrane of the MEMS device. Both backplate connections may be connected to amplifier inputs, which represent virtual ground, representing inverting amplifiers. This may be two independent inverting amplifiers (as shown in FIG. 9) or one differential inverting amplifier.

The output signal to be assessed may be the difference of both outputs. Alternatively, the outputs can be connected to pads (e.g. of a semiconductor die comprising the apparatus) and may be further processed (e.g. subtracted or added) externally. Alternatively, both amplifier outputs may be converted to a single-ended signal (e.g. by adding or subtracting the signals) and may be further processed afterwards. Further, optionally, the signal may be provided to an analog-to-digital-converter (ADC) and may be further processed there. In some applications, the gain or the amplifier may be programmable, which may be achieved by implementing a programmable (adjustable) feedback capacitor.

The potential at the inputs of the amplifiers may be implemented shiftably against each other so that possible symmetry errors of the MEMS can be reduced or balanced.

As already mentioned, optionally, alternatively or additionally to one or more aspects mentioned above, the compensation unit 120 may obtain a compensated sensor signal by combining the sensor signal 112 generated by the sensor unit 110 with a compensation signal 122 so that the compensated sensor signal comprises less nonlinear signal portions than the sensor signal 112 generated by the sensor unit 110. For example, the compensation unit may combine the sensor signal 112 generated by the sensor unit 110 with the compensation signal 122 by subtracting (or adding) the compensation signal 122 from the sensor signal 112 generated by the sensor unit 110. Alternatively, the sensor signal 112 generated by the sensor unit 110 and/or the compensation signal 122 may be amplified or damped by the compensation unit 120 or the sensor unit 110 before combining them.

With regard to a variable capacitor comprising a membrane between two backplates, a compensation unit 120 can be implemented in various ways. Another example may be a compensation unit 120 comprising a bias voltage unit configured to bias a first backplate by a first predefined bias voltage and a second backplate by a second predefined bias voltage. Further, the sensor unit 110 may be connected to the membrane of the variable capacitor 102 and may bias the membrane with a third predefined bias voltage. Further, the sensor unit 110 may generate the sensor signal 112 indicating a varying current from or to the membrane of the variable capacitor 102 caused by a movement of the membrane of the variable capacitor 102. In this way, a reduction of the nonlinear signal portions of the sensor signal 112 can be already achieved at the origin of the varying current. The increase of the capacitance of the variable capacitor for a membrane moving toward one of the backplates is reduced due to the decrease of the capacitance to the other backplate so that the nonlinear behavior shown in FIG. 3 gets more linear, for example.

For this, the different bias voltages may be selected in different ways. For example, the first predefined bias voltage may be different from the second predefined bias voltage and the third predefined bias voltage may be substantially equal to the arithmetic mean of the first predefined bias voltage and the second predefined bias voltage (e.g. neglecting a tolerance of 20%, 10% or 5% of the arithmetic mean, of the first predefined bias voltage or of the second predefined bias voltage). For example, the first predefined bias voltage may be equal to the negative supply voltage of the apparatus, the second predefined bias voltage may be equal to the supply voltage and the third predefined bias voltage may be the ground voltage. Alternatively, the first predefined bias voltage may be the ground voltage, the second predefined bias voltage may be twice the supply voltage, and the third predefined bias voltage may be equal to the supply voltage.

Alternatively, the first predefined bias voltage may be different from the second predefined bias voltage and the third predefined bias voltage may be between the first predefined bias voltage and the second predefined bias voltage. Further, the first predefined bias voltage, the second predefined bias voltage and the third predefined bias voltage may be selected so that the nonlinear signal portions of the sensor signal 112 may be lower than nonlinear signal portions of a sensor signal generated with the third predefined bias voltage being equal to the arithmetic mean of the first predefined bias voltage and the second predefined bias voltage. In other words, the voltage of the membrane may be slightly different from the arithmetic mean of the voltages applied to the backplates so that possible symmetry errors of the variable capacitor 102 are reduced or compensated.

Figure 10:
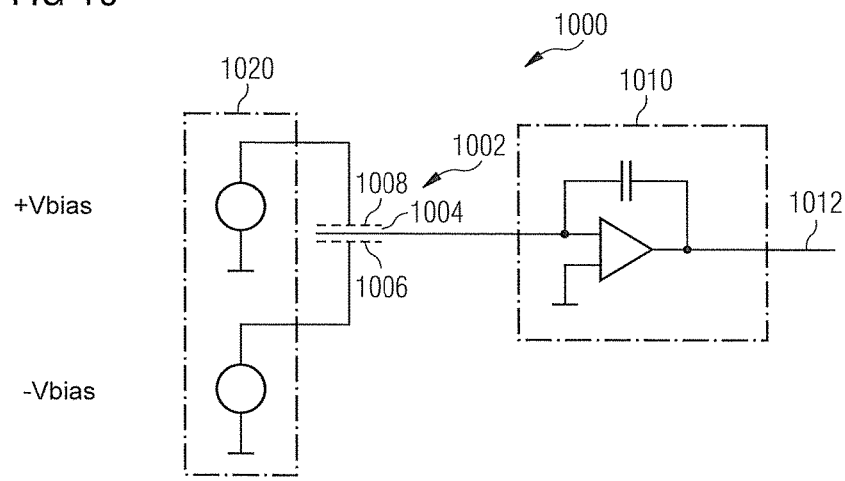
FIG. 10 shows a schematic illustration of a further apparatus for generating a sensor signal.

FIG. 10 shows a schematic illustration of an apparatus 1000 for generating a sensor signal 1012 indicating information on a capacitance of a variable capacitor 1002 according to an embodiment. The variable capacitor 1002 comprises a membrane 1004, a first backplate 1006, and a second backplate 1008. The membrane 1004 may be connected to a sensor unit 1010. The sensor unit 1010 may be implemented according to the example shown and described in FIG. 2. Consequently, the comments and explanations as well as the aspects mentioned in connection with FIG. 2 are also applicable and valid for the sensor unit 1010 of the apparatus 1000. So, the membrane 1004 is connected to an inverting input of the operational amplifier of the sensor unit 1010 and the sensor signal 1012 is provided by an output of the operational amplifier of the sensor unit 1010. The first backplate 1006 and the second backplate 1008 are connected to the compensation unit 1020. The compensation unit 1020 may comprise a bias voltage unit configured to provide two different bias voltages or may comprise two separate bias voltage units (e.g. charge pump) configured to apply different voltages to the first backplate 1006 and the second backplate 1008 as indicated in FIG. 10.

In other words, the topology shown in FIG. 10 may represent a further possible implementation with similar properties. The MEMS device may be biased with a constant voltage. The backplate may be biased with inverse voltages in order to generate the difference of the signals at the current level. Therefore, only one signal is provided at the output, which already represents the difference of the MEMS-signals, for example.

Alternatively, the membrane can be biased with a positive voltage $U_b$, a backplate may be biased to ground and the second backplate may be biased with twice the positive voltage ($2 \times U_b$) in this example.

Alternatively, the voltages between the backplates and the membrane may be selected differently from each other in order to reduce or compensate possible symmetry errors of the MEMS device.

FIG. 10 may represent a readout circuit at constant voltage mode, for example. The MEMS device may comprise a second readout electrode.

Figure 11:
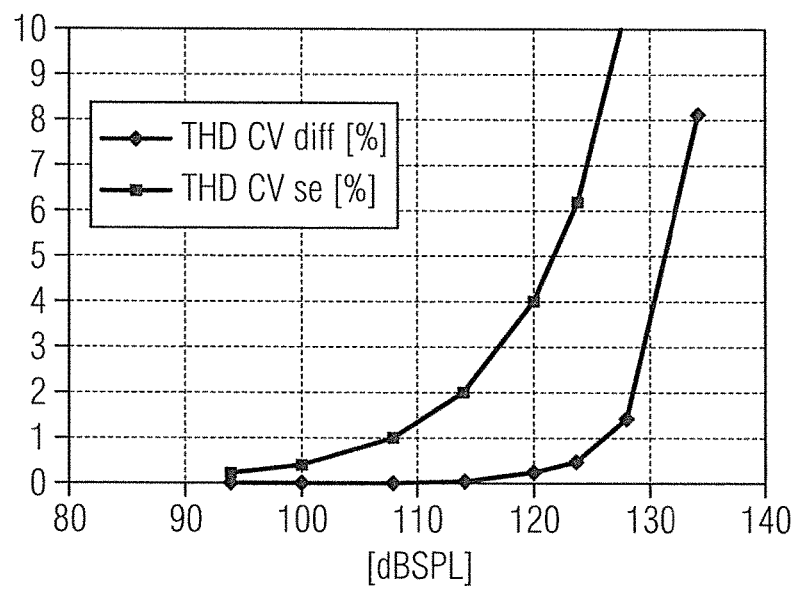
FIG. 11 shows a diagram indicating a linearity over the sound pressure of a proposed apparatus.

FIG. 11 shows an example of a simulation regarding the linearity of an arrangement according to FIG. 10. The harmonic distortion is shown as a function of the sound pressure. The 1%-THD-functionality can be increased from about 108 dBSPL to 128 dBSPL by the (proposed) differential arrangement. In this way, a significantly better performance may be achieved for a new product. In other words, FIG. 11 shows the linearity over the sound pressure for the arrangement.

Some embodiments relate to an apparatus for generating a sensor signal indicating information on a capacitance of a variable capacitor comprising a silicon microphone with the variable capacitor configured to change the capacitance depending on a sound pressure applied to the silicon microphone. In other words, a silicon microphone with an apparatus according to the described concept or an embodiment described above may be implemented. Further, a pressure sensor, a vibration sensor, an acceleration sensor or another sensor using a variable capacitor may be implemented according to the described concept or an embodiment described above.

Some embodiments relate to a circuit topology for a signal generation by capacitive signal sources with nonlinear compensation and/or a double backplate MEMS with current interface. By using the proposed concept, a constant voltage approach (CV) can be used, although the constant voltage approach comprised high distortions before. Various implementation possibilities for digital microphones are illustrated and described above, for example.

Some embodiments relate to an apparatus for generating a sensor signal indicating information on a capacitance of a variable capacitor comprising a variable capacitance. The apparatus comprises a variable capacitor, a bias voltage unit, a sensor unit and a compensation unit. The variable capacitor comprises a variable capacitance and the bias voltage unit is configured to bias the variable capacitor by a predefined bias voltage. Further, the sensor unit is configured to generate a sensor signal indicating information on a varying current flowing through a connection between the sensor unit and the variable capacitor caused by a variation of the capacitance of the variable capacitor while the variable capacitor is biased by a predefined bias voltage. Further, the sensor unit comprises an inverting amplifier with a capacitive feedback connection to an inverting input of the amplifier and the variable capacitor is connected to the inverting input of the amplifier as well. The amplifier is configured to provide an analog sensor signal at an output of the amplifier. Further, the sensor unit comprises an analog-to-digital-converter connected to the amplifier and configured to generate the sensor signal based on an analog-to-digital conversion of the analog sensor signal. The compensation unit is configured to influence the sensor signal or to provide a compensation signal capable of influencing the sensor signal so that the sensor signal comprises less nonlinear signal portions than a sensor signal without the influence of the compensation unit or the compensation signal. Further, the compensation unit is configured to obtain a compensated sensor signal by combining the sensor signal generated by the sensor unit with a compensation signal so that the compensated sensor signal comprises less nonlinear signal portions than the sensor signal generated by the sensor unit or the compensation unit is configured to calculate a compensated sensor signal based on the sensor signal generated by the sensor unit or configured to determine a compensated sensor signal by selecting corresponding date from a lookup table based on the sensor signal generated by the sensor unit.

An example for such an apparatus is shown in FIG. 4.

Further, the apparatus may comprise one or more optional, additional or alternative features corresponding to one or more aspects mentioned in connection with the proposed concept or an embodiment described above.

Some embodiments relate to an apparatus for generating a sensor signal indicating information on a capacitance of a variable capacitor comprising a variable capacitance. The apparatus comprises a variable capacitor, a bias voltage unit, a sensor unit and a compensation unit. The variable capacitor comprises a variable capacitance. Further, the variable capacitor with the variable capacitance comprises a membrane between two backplates. The bias voltage unit is configured to bias the membrane of the varying capacitor by a predefined bias voltage. The sensor unit is configured to generate a sensor signal indicating information on a varying current flowing through a connection between the sensor unit and the variable capacitor caused by a variation of the capacitance of the variable capacitor while the variable capacitor is biased by the predefined bias voltage. Further, the sensor unit comprises an inverting amplifier with a capacitive feedback connected to an inverting input of the amplifier. A first backplate of the variable capacitor is connected to the inverting input of the amplifier as well and the amplifier is configured to provide the sensor signal at an output of the amplifier. The compensation unit is configured to provide a compensation signal, wherein the compensation signal is capable of influencing the sensor signal so that the sensor signal comprises less nonlinear signal portions than a sensor signal without the influence of the compensation signal. Further, the compensation unit comprises an inverting amplifier with a capacitive feedback connected to an inverting input of the amplifier. A second backplate of the variable capacitor is connected to the inverting input of the amplifier as well and the amplifier is configured to provide the compensation signal at an output of the amplifier.

An example for such an apparatus is shown in FIG. 9.

Further, the apparatus may comprise one or more optional, additional or alternative features corresponding to one or more aspects mentioned in connection with the proposed concept or an embodiment described above.

Some embodiments relate to an apparatus for generating a sensor signal indicating information on a capacitance of a variable capacitor comprising a variable capacitance. The apparatus comprises a variable capacitor, a sensor unit and a compensation unit. The variable capacitor comprises a variable capacitance. Further, the variable capacitor with the variable capacitance comprises a membrane between two backplates. The sensor unit is configured to generate a sensor signal indicating information on a varying current flowing through a connection between the sensor unit and the variable capacitor caused by a variation of the capacitance of the variable capacitor while the variable capacitor is biased by a predefined bias voltage. Further, the sensor unit comprises an inverting amplifier with a capacitive feedback connected to an inverting input of the amplifier. The membrane of the variable capacitor is connected to the inverting input of the amplifier as well and the amplifier is configured to provide the sensor signal at an output of the amplifier. The compensation unit is configured to influence the sensor signal so that the sensor signal comprises less nonlinear signal portions than a sensor signal without the influence of the compensation unit. Further, the compensation unit comprises a bias voltage unit configured to bias a first backplate by a first predefined bias voltage and a second backplate by a second predefined bias voltage. The sensor unit is configured to bias the membrane with a third predefined bias voltage and to generate the sensor signal indicating a varying current flowing through a connection between the sensor unit and the variable capacitor caused by movement of the membrane of the variable capacitor.

An example for such an apparatus is shown in FIG. 10.

Further, the apparatus may comprise one or more optional, additional or alternative features corresponding to one or more aspects mentioned in connection with the proposed concept or an embodiment described above.

Figure 12:
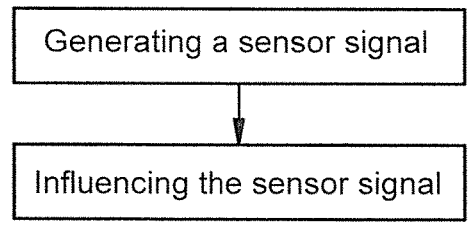
FIG. 12 shows a flowchart of a method for generating a sensor signal.

FIG. 12 shows a flowchart of a method 1200 for generating a sensor signal indicating information on a capacitance of a variable capacitor with a variable capacitance according to an embodiment. The method 1200 comprises generating 1210 a sensor signal indicating a varying current flowing through a connection between the sensor unit and the variable capacitor caused by a variation of the capacitance of the variable capacitor biased by a predefined bias voltage. Further, the method 1200 comprises influencing 1220 the sensor signal by a compensation unit so that the sensor signal comprises less nonlinear signal portions than a sensor signal without the influence of the compensation unit.

Optionally, the variation of the capacitance is caused by a variation of a sound pressure level, for example.

Also optionally, the variation of the sound pressure level comprises an inverse relationship to a variation of the capacitance. An inverse relationship may be a 1/x behavior, for example. However, the inverse relationship may slightly deviate from the 1/x behavior (e.g. due to manufacturing variations). For example, the sound pressure level may be inverse proportional to a variation of the capacitance with a tolerance of less than 30% (or 20% or 10%) of an exactly inverse proportional capacitance.

Further, the method 1200 may comprise one or more optional, additional or alternative steps corresponding to one or more aspects mentioned in connection with the proposed concept or an embodiment described above.

Embodiments may further provide a computer program having a program code for performing one of the above methods, when the computer program is executed on a computer or processor. A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. An apparatus for generating a sensor signal indicating information on a capacitance of a variable capacitor comprising a variable capacitance, the apparatus comprising:
a sensor unit configured to generate a sensor signal indicating information on a varying current flowing through a connection between the sensor unit and the variable capacitor caused by a variation of the capacitance of the variable capacitor while the variable capacitor is biased by at least one predefined bias voltage, wherein the at least one predefined bias voltage is a constant voltage, wherein the sensor unit comprises an inverting operational amplifier with a capacitive feedback connected to an inverting input of the inverting operational amplifier; and
a compensation unit configured to provide a compensation signal to the sensor signal such that the compensation signal is processed along with the sensor signal such that nonlinear signal portions of the sensor signal are reduced;
wherein the compensation unit is configured to calculate a compensated sensor signal based on a digital sensor signal generated by the sensor unit and provide the compensation signal to the variable capacitor;
wherein the variable capacitor with the variable capacitance comprises a membrane between two back plates, wherein the membrane is biased with the at least one predefined bias voltage, wherein the sensor unit is connected to a first back plate of the variable capacitor and is configured to generate the sensor signal indicating a varying current from or to the first back plate of the variable capacitor caused by a movement of the membrane of the variable capacitor, wherein the compensation unit is connected to a second back plate of the variable capacitor and is configured to generate the compensation signal indicating a varying current from or to the second back plate of the variable capacitor caused by the movement of the membrane of the variable capacitor, wherein the second back plate of the variable capacitor is connected to an inverting input of another operational amplifier and the another operational amplifier is configured to provide the compensation signal at an output of the another operational amplifier.

2. The apparatus according to claim 1, wherein the variable capacitor comprises a membrane and at least one back plate, wherein the compensation unit is configured to provide the compensation signal to the sensor signal to reduce the nonlinear signal portions of the sensor signal that are related to a nonlinear correlation of the varying current and a distance between the membrane and the at least one back plate.

3. The apparatus according to claim 1, wherein the compensation unit is configured to generate the compensation signal indicating an approximation of an inverse of the nonlinear signal portions of the sensor signal.

4. The apparatus according to claim 3, wherein the compensation unit is configured to generate the compensation signal based on an approximation by a polynomial of the second order or the third order of the sensor signal.

5. The apparatus according to claim 1, wherein the sensor unit comprises an analog-to-digital-converter configured to generate the sensor signal and the digital sensor signal based on one or more analog to digital conversions of an analog sensor signal indicating the varying current flowing through the connection between the sensor unit and the variable capacitor caused by the variation of the capacitance of the variable capacitor biased by the at least one predefined bias voltage.

6. The apparatus according to claim 1, comprising a bias voltage unit, wherein the at least one predefined bias voltage comprises a first, second, and third predefined bias voltage, wherein the sensor unit is configured to bias the first back plate by the first predefined bias voltage, wherein the compensation unit is configured to bias the second back plate by the second predefined bias voltage, wherein the bias voltage unit is configured to bias the membrane by the third predefined bias voltage, wherein the first predefined bias voltage, the second predefined bias voltage and the third predefined bias voltage are selected so that the nonlinear signal portions of the sensor signal are lower than the nonlinear signal portions of a sensor signal generated with the first predefined bias voltage being equal to the second predefined bias voltage.

7. The apparatus according to claim 1, wherein the compensation unit is configured to generate the compensated sensor signal by combining the sensor signal generated by the sensor unit with the compensation signal so that the compensated sensor signal comprises less of the nonlinear signal portions than the sensor signal generated by the sensor unit.

8. The apparatus according to claim 7, wherein the compensation unit is configured to combine the sensor signal generated by the sensor unit with the compensation signal by subtracting the compensation signal from the sensor signal generated by the sensor unit.

9. The apparatus according to claim 1, wherein the variable capacitor is connected to the inverting input of the operational amplifier and the operational amplifier is configured to provide the sensor signal at an output of the operational amplifier.

10. The apparatus according to claim 1, comprising a silicon microphone with the variable capacitor configured to change the capacitance depending on a sound pressure applied to the silicon microphone.

11. An apparatus for generating a sensor signal indicating information on a capacitance of a variable capacitor comprising a variable capacitance, the apparatus comprising:
the variable capacitor comprising the variable capacitance;
a bias voltage unit configured to bias the variable capacitor by a predefined bias voltage;
a sensor unit configured to generate a digital sensor signal and the sensor signal indicating information on a varying current flowing through a connection between the sensor unit and the variable capacitor caused by a variation of the capacitance of the variable capacitor while the variable capacitor is biased by the predefined bias voltage,
wherein the sensor unit comprises an analog-to-digital-converter connected to an operational amplifier and configured to generate the digital sensor signal based on an analog to digital conversion of an analog sensor signal, wherein the operational amplifier of the sensor unit comprises an inverting operational amplifier with a capacitive feedback connected to an inverting input of the operational amplifier; and
a compensation unit configured to provide a compensation signal to the sensor signal such that the compensation signal is processed along with the sensor signal such that nonlinear signal portions of the sensor signal are reduced,
wherein the compensation unit is configured to calculate a compensated sensor signal based on the digital sensor signal generated by the sensor unit and provide the compensation signal to a node at an output of the sensor unit,
wherein the variable capacitor with a variable capacitance comprises a membrane between two back plates, wherein the membrane is biased with the predefined bias voltage, wherein the sensor unit is connected to a first back plate of the variable capacitor and is configured to generate the sensor signal indicating a varying current from or to the first back plate of the variable capacitor caused by a movement of the membrane of the variable capacitor, wherein the compensation unit is connected to a second back plate of the variable capacitor and is configured to generate the compensation signal indicating a varying current from or to the second back plate of the variable capacitor caused by the movement of the membrane of the variable capacitor, wherein the second back plate of the variable capacitor is connected to an inverting input of another operational amplifier and the another operational amplifier is configured to provide the compensation signal at an output of the another operational amplifier.

12. An apparatus for generating a sensor signal indicating information on a capacitance of a variable capacitor comprising a variable capacitance, the apparatus comprising:
the variable capacitor comprising the variable capacitance, wherein the variable capacitor with the variable capacitance comprises a membrane between two back plates, wherein one back plate is formed by a bottom of a cavity below the membrane;
a bias voltage unit configured to bias the membrane of the variable capacitor by a predefined bias voltage;
a sensor unit configured to generate a sensor signal indicating information on a varying current flowing through a connection between the sensor unit and the variable capacitor caused by a variation of the capacitance of the variable capacitor while the variable capacitor is biased by the predefined bias voltage, wherein the sensor unit comprises an inverting operational amplifier with a capacitive feedback connected to an inverting input of the operational amplifier of the sensor unit; and
a compensation unit configured to provide a compensation signal to the sensor signal such that the compensation signal is processed along with the sensor signal such that nonlinear signal portions of the sensor signal are reduced, wherein the compensation unit is configured to calculate a compensated sensor signal based on a digital sensor signal generated by the sensor unit, and provide the compensation signal to the variable capacitor;

wherein a first back plate of the variable capacitor is connected to the inverting input of the operational amplifier of the sensor unit and the operational amplifier of the sensor unit is configured to provide the sensor signal at the output of the operational amplifier of the sensor unit, wherein the compensation unit comprises an inverting operational amplifier with a capacitive feedback connected to an inverting input of the operational amplifier of the compensation unit, wherein a second back plate of the variable capacitor is connected to the inverting input of the operational amplifier of the compensation unit and the operational amplifier of the compensation unit is configured to provide the compensation signal at an output of the operational amplifier of the compensation unit.

13. An apparatus for generating a sensor signal indicating information on a capacitance of a variable capacitor comprising a variable capacitance, the apparatus comprising:

the variable capacitor comprising the variable capacitance, wherein the variable capacitor with the variable capacitance comprises a membrane between two back plates, wherein one back plate is formed by a bottom of a cavity below the membrane;

a sensor unit configured to generate a sensor signal indicating information on a varying current flowing through a connection between the sensor unit and the variable capacitor caused by a variation of the capacitance of the variable capacitor while the variable capacitor is biased by a predefined bias voltage, wherein the sensor unit comprises an inverting operational amplifier with a capacitive feedback connected to an inverting input of the operational amplifier, wherein the capacitive feedback is configured to programmably adjust a gain of the inverting operational amplifier; and a compensation unit configured to influence the sensor signal by providing a compensation signal reducing nonlinear signal portions of the sensor signal with a compensation signal, calculate a compensated sensor signal based on a digital sensor signal generated by the sensor unit and provide the compensation signal to the variable capacitor, wherein a first back plate of the variable capacitor is connected to the inverting input of the operational amplifier of the sensor unit and the operational amplifier of the sensor unit is configured to provide the sensor signal at the output of the operational amplifier of the sensor unit, wherein the compensation unit comprises an inverting operational amplifier with a capacitive feedback connected to an inverting input of the operational amplifier of the compensation unit, wherein a second back plate of the variable capacitor is connected to the inverting input of the operational amplifier of the compensation unit and the operational amplifier of the compensation unit is configured to provide the compensation signal at an output of the operational amplifier of the compensation unit.

14. The apparatus according to claim 13, wherein the compensation unit comprises a bias voltage unit configured to bias the first back plate by a first predefined bias voltage and the second back plate by a second predefined bias voltage, wherein the sensor unit is configured to bias the membrane with a third predefined bias voltage and to generate the sensor signal indicating a varying current flowing through a connection between the sensor unit and the variable capacitor caused by a movement of the membrane of the variable capacitor.

15. The apparatus according to claim 13, comprising a silicon microphone with the variable capacitor configured to change the capacitance depending on a sound pressure applied to the silicon microphone.

16. A method for generating a sensor signal indicating information on a capacitance of a variable capacitor with a variable capacitance, the method comprising:

generating a sensor signal indicating a varying current flowing through a connection between a sensor unit and the variable capacitor caused by a variation of the capacitance of the variable capacitor biased by a predefined bias voltage, wherein the predefined bias voltage is a constant voltage, and wherein the sensor unit comprises an inverting operational amplifier with a capacitive feedback connected to an inverting input of the operational amplifier; and influencing the sensor signal by a compensation unit by providing a compensation signal to the sensor signal directly at an output of the sensor unit such that the compensation signal is processed along with the sensor signal to reduce nonlinear signal portions of the sensor signal, wherein a first back plate of the variable capacitor is connected to the inverting input of the operational amplifier of the sensor unit and the operational amplifier of the sensor unit is configured to provide the sensor signal at the output of the operational amplifier of the sensor unit, wherein the compensation unit comprises an inverting operational amplifier with a capacitive feedback connected to an inverting input of the operational amplifier of the compensation unit, wherein a second back plate of the variable capacitor is connected to the inverting input of the operational amplifier of the compensation unit and the operational amplifier of the compensation unit is configured to provide the compensation signal at an output of the operational amplifier of the compensation unit.

17. The method according to claim 16, wherein the variation of the capacitance is caused by a variation of a sound pressure level.

18. The method according to claim 17, wherein the variation of the sound pressure level comprises an inverse relationship to a variation of the capacitance.

\* \* \* \* \*